United States Patent [19]

Mears et al.

[11] Patent Number: 4,580,058

[45] Date of Patent: Apr. 1, 1986

[54] SCANNING TREATMENT APPARATUS

[75] Inventors: Eric L. Mears; Peter H. Rose, both of Rockport, Mass.

[73] Assignee: Zymet, Inc., Danvers, Mass.

[21] Appl. No.: 594,756

[22] Filed: Mar. 29, 1984

[51] Int. Cl.⁴ .............................................. G21K 1/08
[52] U.S. Cl. .............................. 250/396 R; 250/492.2
[58] Field of Search .......... 250/396, 400, 492.1–492.3, 250/423 R, 492.21; 74/471 R; 313/361.1, 363.1; 315/111.81

[56] References Cited

U.S. PATENT DOCUMENTS 3,543,717 12/1970 Adachi ..................................... 118/7
3,778,626 12/1973 Robertson ........................... 250/492
4,128,765 12/1978 Franks ................................ 250/442

Primary Examiner—Bruce C. Anderson
Assistant Examiner—Paul A. Guss

[57] ABSTRACT

Scanning, as of ion beams, in which two radially aligned devices, e.g. ion source and extraction electrode, are isolated from and accurately positioned with respect to one another, while the second device moves arcuately to produce a scanning effect. Advantageously, while one device, e.g. the ion source, is moved by a rotating shaft, the second device, e.g., the extraction electrode, moves on a curved track centered on the axis of the shaft. While the devices are disposed within respective parts of a vacuum chamber, a mechanical synchronizing mechanism, located outside of the chamber, moves the devices via seals. The specific mechanism shown comprises a driven lead screw, an insulating crank for driving a shaft on which an ion source is mounted, and an arcuate motion tracking device which transmits the motion of the insulating crank into the chamber for driving the extraction electrode upon a curved track.

18 Claims, 7 Drawing Figures

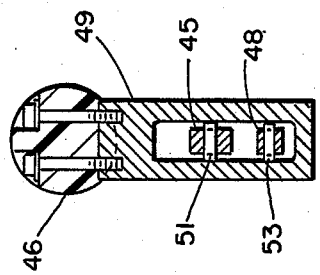
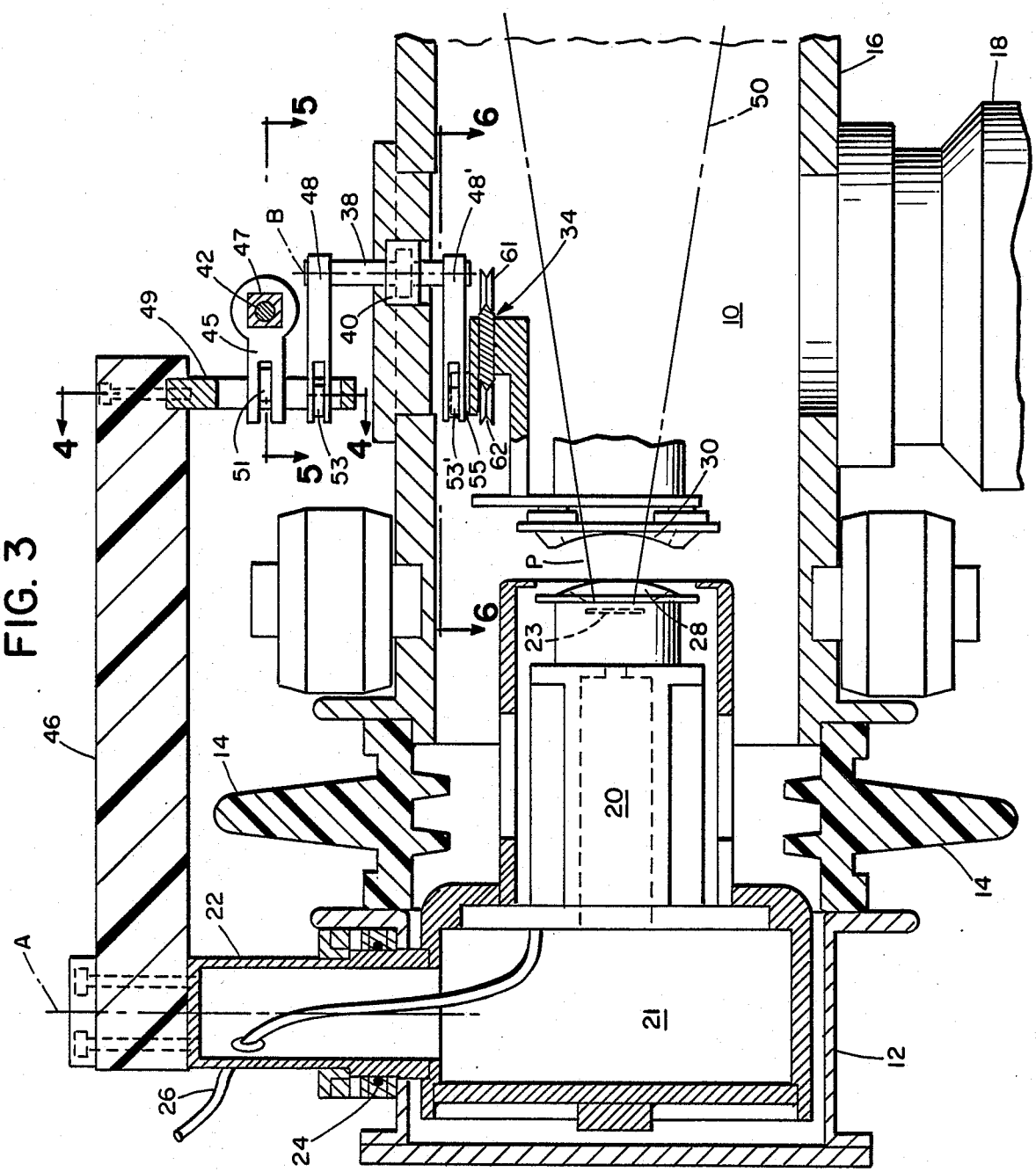

FIG. 5
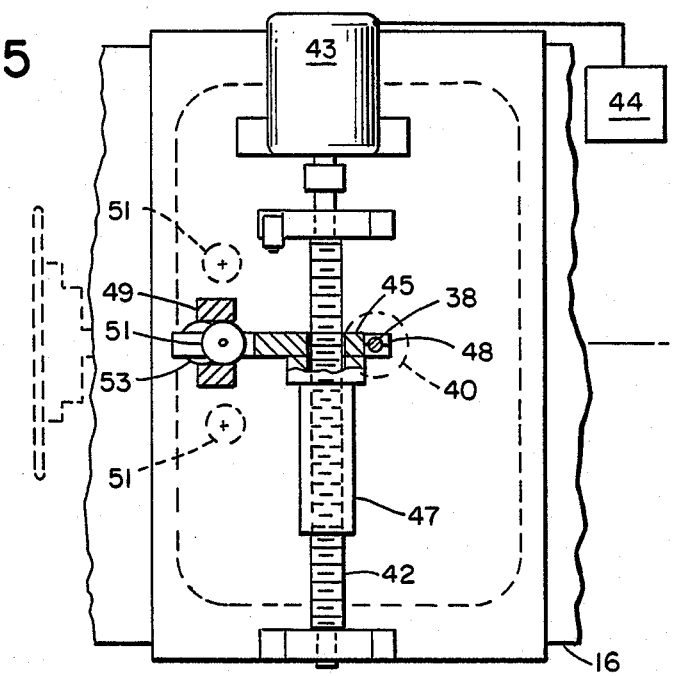
FIG. 6
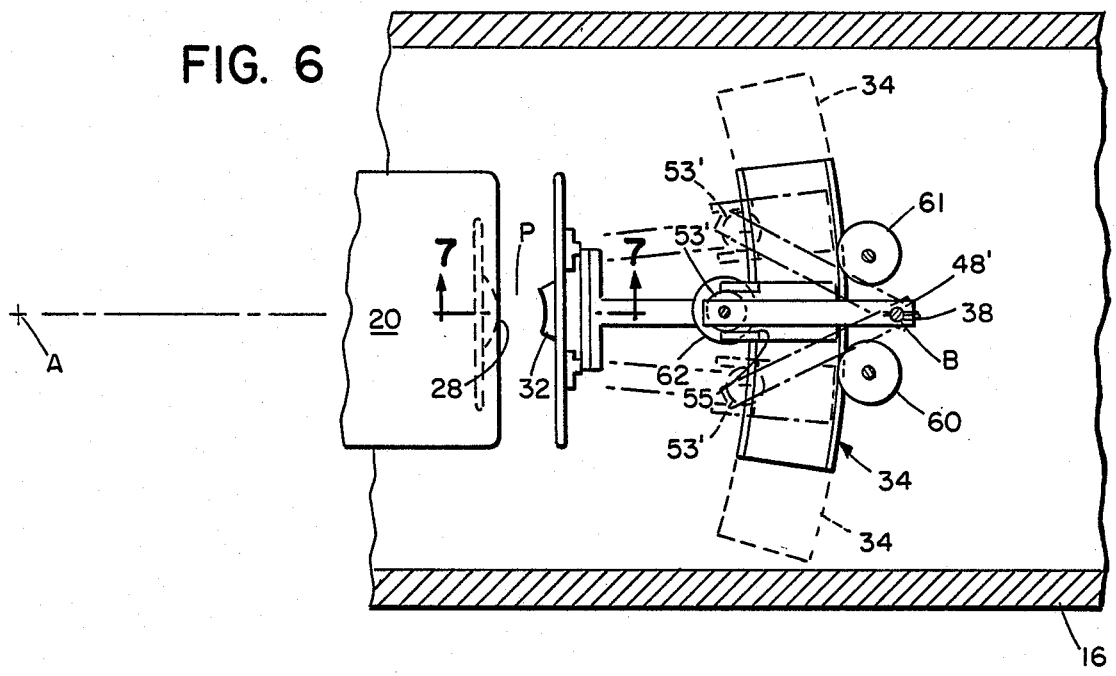
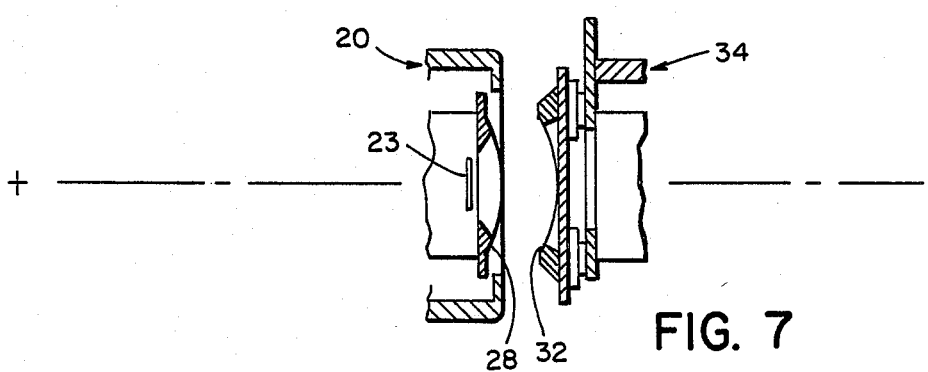
FIG. 7

SCANNING TREATMENT APPARATUS

BACKGROUND OF THE INVENTION

Ion beams are often scanned across a target within an evacuated treatment chamber using electrostatic or electromagnetic means. Electrostatic scanning has the disadvantage that at high ion beam currents the ion beam blows up under internal space charge forces. Magnetic scanning involves the use of large magnets, it is often clumsy, expensive, and increases the beam line length, and thus requires a long chamber. These problems are accentuated when it is desired to treat large target areas with high ion beam currents. Use of mechanical motion to sweep an ion beam by configuring the ion source and extraction electrode as an ion gun faces a number of difficulties because the apparatus should be simple, compact, and avoid large seals, the relationship between the ion source and the extraction electrode must be held to close tolerance and the ion accelerating voltage, often in the range of 50 to 120 kilovolts or higher, must be held between the ion source and the adjacent extraction electrode. Insulation between these closely positioned parts is difficult in the hostile vacuum environment of high voltages, high ionization and the presence of un-ionized gas molecules that escape from the ion source.

Similar problems are faced with other scanning devices in treatment chambers which employ high voltages or other conditions.

SUMMARY OF THE INVENTION

An important aspect of the present invention is to provide scanning of charged particles within a vacuum chamber without using insulating standoffs in the vacuum between the source of charged particles and the extraction electrode.

The invention applies to an ion implanter or the like comprising, within a chamber, the ion source, the apertured extraction electrode spaced from, and having its aperture disposed in the path of ions from the source, means for maintaining a high voltage potential between the source and electrode to accelerate ions in the path and to project an ion beam from the electrode, and a work station for positioning a work piece for treatment in the path of the ion beam.

The invention preferably employs an extraction electrode having its aperture shaped to cause the beam to expand in one transverse direction as it proceeds from the electrode to the work station. The invention features the extraction electrode mounted separate and insulated from the source of charge particles, and driven on means to produce movement of the electrode through an arc that maintains the aperture in the path of particles from the source and keeps substantially constant the distance of the electrode from the source, the direction of the arcuate motion of the electrode being in a plane at right angles to the direction of any transverse expansion of the beam, the motion of the electrode adapted to sweep the beam in a fan-like pattern, thereby to enable the beam to treat a large area of the work piece.

In preferred embodiments the source is mounted and driven to also sweep through an arc and a synchronizing means synchronizes the movement of the source and the extrcation electrode to maintain the aforesaid relationships; the synchronizing means comprises a driving means located outside of the chamber; respective motion transmitting means extend from outside, through seals in the wall of the chamber to the source and the extraction electrode; the synchronizing means comprises a driven lead screw and cranks, driven by the lead screw, are arranged to drive respective shafts; the crank by which the source is driven is an insulator; and the shaft which drives the electrode has a pair of parallel arms inside and outside of the chamber, respectively, arranged so that arcuate drive motion tracked by the arm outside of the chamber is identically reproduced within the chamber, to drive the electrode in its arcuate path.

According to the presently most preferred embodiment, an ion source and the shaft on which it is mounted are at high voltage, typically 50 to 120 kilovolts. The extration electrode is mounted within the vacuum on a curved track which is driven by an arm and by a rotatable shaft which extends through a vacuum seal to atmosphere. The track and extraction electrode are at, or near, ground potential, and the track curvature coincides with the center of the ion source shaft. An insulating bushing separates the high voltage and ground components of the vacuum system. The ion source and extraction electrode mechanisms are connected by means of an insulating rod which is driven by a motorized lead screw at ground potential. Initially, the extraction electrode is aligned mechanically to the ion source. Thereafter, using the mechanism described, the extraction electrode synchronously tracks the side-to-side movement of the ion source, thus creating an ion gun without the use of insulating standoffs in the vacuum.

In a more general aspect, the invention applies to use of separate shaft and curved track driving arrangements to achieve coordinated arcuate movement about a common axis of related devices that are not directly connected.

DESCRIPTION OF THE DRAWINGS

FIG. 3 is a cross-sectional view in greater detail of the mechanism that achieves scanning of the ion beam in the embodiment of FIG. 1;

FIG. 4 is a vertical cross-sectional view taken along line 4—4 of FIG. 3 showing the end of the large crank, and its depending arm and bearing;

FIG. 5 is a horizontal cross-sectional view taken on line 5—5 of FIG. 3 showing further details of the relationship of the lead screw to the depending arm;

FIG. 6 is a horizontal cross-section view taken on line 6—6 of FIG. 3 showing the arcuate carriage and extraction electrode and its relationship to the ion source; and FIG. 7 is a view taken on line 7—7 of FIG. 6 showing the diverging apertures of the ion source and extraction electrode.

DETAILED DESCRIPTION OF PREFERRED EMBODIMENT

Figure 1:
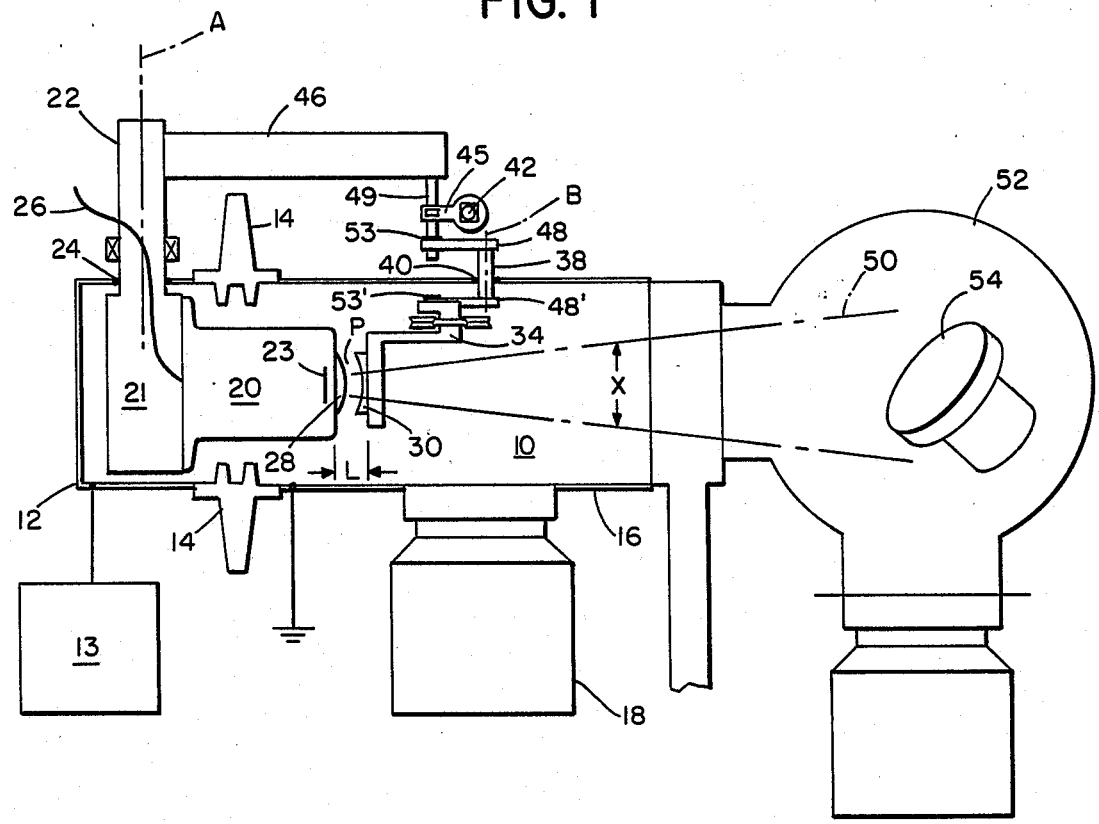
FIG. 1 is a diagrammatic side view of a preferred ion implanter according to the imvention.
Figure 2:
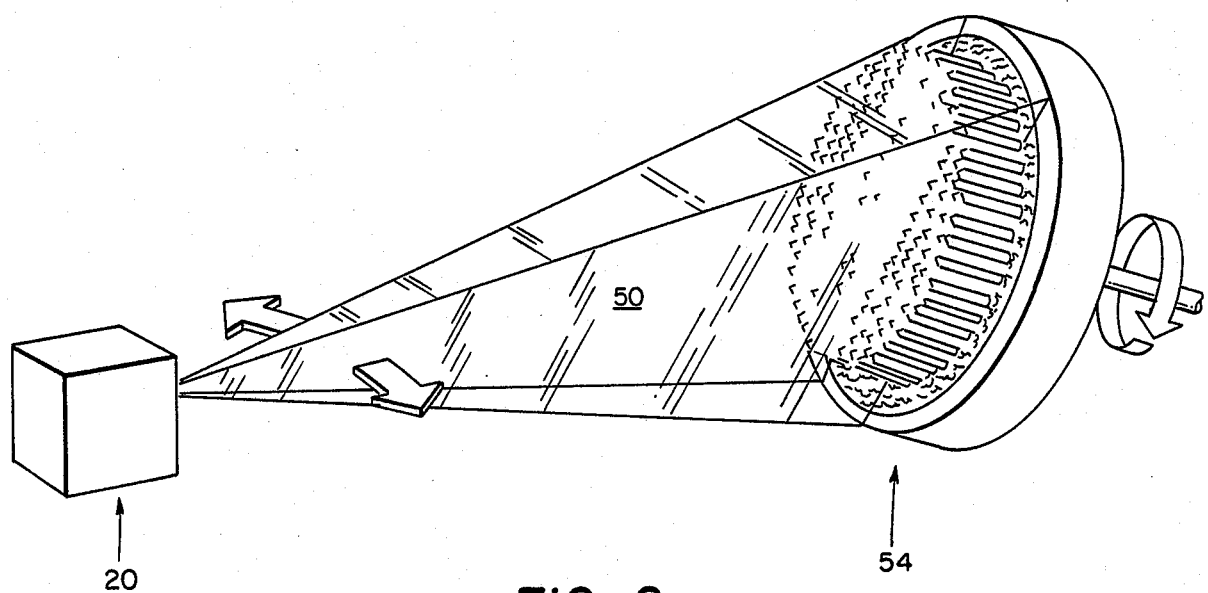
FIG. 2 is a diagrammatic perspective view of the ion beam produced by the implanter of FIG. 1.

Referring to FIG. 1, an ion implanter comprises a vacuum chamber defined by a high voltage section 12, powered by voltage source 13 and mounted by annular insulators 14 to a longer electrically grounded section 16, the chamber being evacuated by pump 18.

Ion source 20 is mounted within the high voltage section for limited sweeping motion about axis A on rotatable shaft 22 which extends through the chamber wall via rotatable seal 24.

Ion source 20 may be of conventional construction, having enclosure 21 provided with a source of the species to be ionized, e.g. gas line 26, which introduces nitrogen. An energized filament 23 produces a plasma within the enclosure. The thus-produced ions escape from the enclosure through aperture 28.

The extraction electrode 30 is mounted within electrically grounded section 16, and has its aperture 32 (FIG. 6) aligned with path P of ions from the ion source aperture 28. Electrode 30 is mounted to move in a limited arc, on a curved track in sweeping motion parallel to and in synchronism with movement of ion source 20 such that electrode aperture 32 is maintained in precise alignment with ion source aperture 28, while distance L between the two apertures is maintained constant, thus to ensure constant geometry of the ion beam being formed.

A crank arm 48' within the chamber drives the electrode 30 along its track, being in turn driven about axis B by rotary shaft 38 which extends through seal 40.

A lead screw 42, driven by motor 43, FIG. 5, is disposed outside of chamber 10, and drives the shafts 22 and 38 in dependent relationship by respective cranks 46 and 48. Crank 46 is of insulating material, e.g. acrylic resin, and thus enables high voltage to be maintained between the two parts of the system.

The ion beam 50 formed by the extraction electrode 30 proceeds along its beam line to work station 52 at the other end of chamber 10, where a work piece 54 is exposed to the beam.

As shown in FIGS. 1 and 7, the extraction electrode is convexly curved relative to the beam line, about an axis which is perpendicular to the axis A about which the ion beam sweeps. This electrode curvature causes the beam to diverge transversely in the plane of curvature, angle X in FIG. 1.

Dependent limited rotation causes the ion source and extraction electrode, while separate and insulated from one another, to move through a predetermined arc in close synchronism. Thus, at all times the ion beam formed has the same geometrical properties. The controller 44 for motor 43 causes the lead screw to rotate at a desired rate over a desired distance in first one direction and then the other, causing the ion source to sweep back and forth through a predetermined arc, e.g. 10 degrees, 5 degrees on either side of the center axis of the implanter.

The accurate tracking of the extraction electrode relative to the ion source of the preferred embodiment will now be described in detail, referring to FIGS. 3-7.

Lead screw 42 on the outside of the chamber is driven by axially aligned, rotary stepper motor 43 (FIG. 5) causing lead screw arm 45 to translate with the nut 47. The crank 46 for turning rotatable shaft 22 and source 20 within the chamber about axis A has, at its free end, a depending arm 49 which follows lead screw arm 45 through bearing 51. A second, relatively short crank 48 for moving the extraction electrode has a bearing 53 engaged upon depending arm 48. As shown in FIG. 3, both bearings 51, 53 are confined for sliding movement within the slot defined in depending arm 49 during arcuate movement of lead screw arm 45 and crank 48, respectively. Accordingly, as lead screw arm 45 translates, bearing 53 is dependently driven by arm 49 so that it traces the arcuate displacement of arm 49 and crank 46 relative to axis A. Shaft 38 turned by bearing 53 on the outside of the chamber, passes into the chamber through ferrofluidic seal 40 and has mounted on its other end, within the chamber, a return arm 48', of length identical to arm 48, which mounts bearing 53' in a position which is axially aligned with bearing 53. Thus arcuate movement of bearing 53 about axis A is identically followed by bearing 53'. Referring to FIG. 6, the arcuate track on which the extraction electrode moves is realized by the combination of carriage 34 of circular form centered on axis A and a set of rollers 60, 61, 62 which turn on fixed axes, and confine the carriage to a circular movement in the direction of the curvature of the carriage about axis A. The bearing 53' moving longitudinally within slot 55 of the carrigae thus drives the electrode carriage in an arc concentric with the path of the ion source, about axis A, in synchronized movement. By this means the spacing and relationship of the extraction electrode with the ion source is accurately maintained during scanning movement of the assembly.

Through the combined effect of the thus-achieved fan-shaped sweeping of the beam in one transverse direction and the divergence of the beam in the other transverse direction, it becomes possible to treat a very wide area of the work-piece with a relatively simple, small and inexpensive unit. Because the angle of incidence of the ions on the work surface does not vary appreciably (5 degrees or less at the edge of the exposed area relative to that at the center) the implantation has sufficient uniformity to provide desired effects as for the purpose of increasing the wear resistance of otherwise favorably altering the surface of metal objects by implantation of selected ion species.

OTHER EMBODIMENTS

In another embodiment, a direct extension of the arm 49 which depends from crank 46 may pass through a sliding seal into the chamber, and drive the electrode carriage directly.

In still another embodiment, separate motors located outside of the chamber may drive the source 20 and the extraction electrode 30, and synchronization may be achieved by electrical means according to a predetermined electrical transfer function.

In cases in which the swept arc need not be large, it is possible to drive the separately mounted and insulated extraction electrode through a limited arc, while keeping the ion source stationary, the ion source having a suitably shaped exit aperture such that the aperture of the extraction electrode remains aligned with it through the range of electrode movement.

In another embodiment, an electron source may be substituted for the ion source with suitable reversal of the voltage.

These and other embodiments are included in certain of the following claims:

We claim:

1. Apparatus for scanning a beam of electrically charged particles across a target comprising, within a chamber, a source of said charged particles, an apertured extraction electrode spaced from and having its aperture disposed in the path of particles from said source, means for maintaining a high voltage potential between said source and said electrode to accelerate said particles in said path and to project a beam from said electrode, and a work station for positioning a work piece for treatment in the path of said beam, that improvement wherein said electrode is mounted
separate and insulated from said source on means to produce movement of said electrode through an arc that maintains said aperture in the path of particles from said source and keeps substantially constant the distance of said electrode from said source, and means to drive said electrode through a limited arc to sweep said beam in a fan-like pattern thereby to treat a large area of said work piece with said beam.

2. In an ion implanter apparatus or the like comprising, within a chamber, an ion source, an apertured extraction electrode spaced from and having its aperture disposed in the path of ions from said source, means for maintaining a high voltage potential between said source and said electrode to accelerate ions in said path and to project an ion beam from said electrode, and work station for positioning a work piece for treatment in the path of said ion beam, that improvement wherein said electrode is mounted separate and insulated from said ion source on means to produce movement of said electrode through an arc that maintains said aperture in the path of ions from said source and keeps substantially constant the distance of said electrode from said ion source, and means to drive said electrode through a limited arc to sweep said beam in a fan-like pattern thereby to treat a large area of said work piece with said ion beam.

3. The apparatus of claim 1 wherein the aperture of said extraction electrode is shaped to cause said beam to expand in one transverse direction as it proceeds from said electrode to said work station, the direction of said motion of said electrode being in a plane at right angles to the direction of said transverse expansion of said beam.

4. The apparatus of claim 1 wherein said source is mounted and driven to sweep through an arc, and a synchronizing means synchronizes the movement of said source and said extraction electrode to maintain the aforesaid relationships.

5. The apparatus of claim 4 wherein said synchronizing means comprises a driving means located outside of said chamber.

6. The apparatus of claim 5 wherein a rotatable drive shaft extends from said synchronizing means, through a seal in the wall of said chamber to said source.

7. The apparatus of claim 6 wherein said synchronizing means comprises a driven lead screw and a crank driven by said lead screw, arranged to drive the shaft on which said source is mounted.

8. The apparatus of claim 7 wherein the crank which drives the shaft on which the source is mounted is an insulator.

9. The apparatus of claim 4 wherein said extraction electrode is mounted to travel on a curved track, said curved track centered upon the center of rotation of said source.

10. In an ion implanter or the like comprising, within a chamber, an ion source, an apertured extraction electrode spaced from, and having its aperture disposed in the path of ions from, said source, means for maintaining a high voltage potential between said source and electrode to accelerate ions in said path and to project an ion beam from said electrode, and a work station for positioning a work piece for treatment in the path of said ion beam, that improvement wherein the aperture of said extraction electrode is shaped to cause said ion beam to expand in one transverse direction as it proceeds from said electrode to said work station.

said electrode is mounted separate from and insulated from said ion source and is driven on means to produce movement of said electrode through an arc.

said ion source is mounted on means and is driven to sweep through an arc in synchronism with said electrode.

said movements serving to maintain said aperture of said extraction electrode aligned with the path of ions from said source and to keep constant the distance of said electrode from said ion source, the direction of said arcuate motion of said electrode and said ion source being in a plane at right angles to the direction of said transverse expansion of said beam, adapted to sweep said beam in a fan-like pattern thereby to treat a large area of said work piece with said ion beam.

11. The implanter of claim 10 wherein said ion source is driven by a rotatable drive shaft which extends through a seal in the wall of said chamber from said ion source to a synchronizing means located outside of said chamber, which synchronizes the movement of said ion source and said extraction electrode to maintain the aforesaid relationships.

12. The implanter of claim 11 wherein said synchronizing means comprises a driven lead screw and a crank driven by said lead screw, arranged to drive said shaft.

13. The implanter of claim 11 wherein the crank which drives the shaft on which the ion source is mounted includes an insulator.

14. A charged particle beam scanning system for moving, by means disposed outside of a work chamber, two devices within a work chamber in identical arcuate, radially aligned paths while accurately maintaining the radial spacing between said devices, said system comprising a rotary shaft extending along a predetermined axis through the wall of said work chamber and carrying thereon a first of said devices, a crank disposed outside of said chamber connected to said shaft and extending to the vicinity of a drive means, a follower means adapted to move the end of said crank in response to motion of said drive means, a motion translating means, adapted to move dependently with arcuate motion of said crank, and to reproduce said arcuate motion within said work chamber, a carriage driven by said motion translation means, to follow an arcuate path centered on said predetermined axis, said carriage positioning said second device in radial alignment with the first said device, whereby motion of said drive means causes identical arcuate motion of said devices.

15. The system of claim 14 wherein said carriage comprises a curved guiding element mounted between rollers in the manner that the carriage traces a curved path determined by said curved guiding element.

16. A charged particle beam scanning system for driving two devices in identical arcuate, radially aligned paths about a predetermine axis while accurately maintaining the radial spacing between said devices, comprising a rotary shaft extending along said predetermined axis, carrying thereon a first of said devices, means to rotate said shaft, a carriage for a second device mounted to follow an arcuate path centered on and spaced from said predetermined axis, said carriage positioning said second device in radial alignment with the first said device, and means for synchronizing the rotary movement of said shaft and the arcuate movement of said carriage whereby identical arcuate motion of said devices occurs.

17. The scanning system of claim 16 wherein said shaft and said carriage are disposed within a treatment chamber and are driven by means located outside of said treatment chamber.

18. The scanning system of claim 16 in which said devices are maintained at substantially different electrical potentials, said means for synchronizing said movements comprises a mechanical linkage, and at least one link of said linkage is an insulator which cooperates to maintain said difference in potential.

* * * * *

UNITED STATES PATENT AND TRADEMARK OFFICE
CERTIFICATE OF CORRECTION

PATENT NO. : 4,580,058
DATED : April 1, 1986
INVENTOR(S) : Eric L. Mears et al.

It is certified that error appears in the above-identified patent and that said Letters Patent is hereby corrected as shown below:

Column 1, line 66, "extrcation" should read -- extraction --.

Column 2, line 41, "imvention" should read -- invention --.

Column 2, line 49, "bearing" should resd -- bearings --.

Column 4, line 30, "of", second occurrence should read

-- or --.

Signed and Sealed this

Twenty-second Day of July 1986

[SEAL]

Attest:

DONALD J. QUIGG

Attesting Officer

Commissioner of Patents and Trademarks